United States Patent [19]
Easley et al.

[11] Patent Number: 6,099,645
[45] Date of Patent: Aug. 8, 2000

[54] VERTICAL SEMICONDUCTOR WAFER CARRIER WITH SLATS

[75] Inventors: Micheal E. Easley, Perrin; Ronald E. Plummer, Decatur, both of Tex.

[73] Assignee: Union Oil Company of California, El Segundo, Calif.

[21] Appl. No.: 09/350,389

[22] Filed: Jul. 9, 1999

[51] Int. Cl.[7] .................................................. C23C 16/00
[52] U.S. Cl. .......................................... 118/500; 118/728
[58] Field of Search .................................... 118/728, 500

[56] References Cited

U.S. PATENT DOCUMENTS

| | | | |
|---|---|---|---|
| 4,153,164 | 5/1979 | Hofmeister et al. | 211/41 |
| 4,407,654 | 10/1983 | Irwin | 432/258 |
| 5,219,079 | 6/1993 | Nakamura | 211/41 |
| 5,431,561 | 7/1995 | Yamabe et al. | 432/253 |
| 5,492,229 | 2/1996 | Tanaka et al. | 211/41 |
| 5,494,524 | 2/1996 | Inaba et al. | 118/728 |
| 5,507,873 | 4/1996 | Ishizuka et al. | 118/728 |
| 5,534,074 | 7/1996 | Koons | 118/728 |
| 5,586,880 | 12/1996 | Ohsawa | 432/241 |
| 5,865,320 | 2/1999 | Hamada | 211/40 |
| 5,865,321 | 2/1999 | Tomanovich | 211/40 |
| 5,897,311 | 4/1999 | Nishi | 432/239 |

FOREIGN PATENT DOCUMENTS 6349758 12/1994 Japan .
WO9206342 4/1992 WIPO .

*Primary Examiner*—Richard Bueker
*Attorney, Agent, or Firm*—Yale S. Finkle; Gregory F. Wirzbicki

[57] ABSTRACT

An apparatus for holding a plurality of semiconductor wafers during heat treatment of the wafers in a furnace, which apparatus comprises a plurality of support members or rails extending essentially vertically between a top and bottom plate. At least two of the support members are located toward the front of the carrier where the wafers are inserted, and at least one support member is located toward the back of the carrier. A first plurality of slats is attached to one of the front support members and to a back support member such that the space between the top surface of one slat and the bottom surface of the next higher adjacent slat forms a slot for receiving a portion of a semiconductor wafer. A second plurality of slats is attached to another front support member and to a back support member to form corresponding slots on another side of the carrier for receiving another portion of a semiconductor wafer. Preferably, each slat contains at least one raised structure which is used to support the underside of a semiconductor wafer. Such an apparatus having multiple slats interconnected with the vertical support members provides a strong carrier for uniformly supporting larger wafers, i.e., wafers having a nominal diameter greater than about 200 millimeters, such that their own weight does not cause the wafers to sag and thereby produce crystal dislocations or slip when the wafers are heated to high temperatures.

47 Claims, 4 Drawing Sheets

VERTICAL SEMICONDUCTOR WAFER CARRIER WITH SLATS

BACKGROUND OF INVENTION

This invention relates generally to vertical carriers or boats for holding semiconductor wafers during heat processing and is particularly concerned with a vertical carrier designed to effectively support large semiconductor wafers having nominal diameters equal to or greater than about 200 millimeters, preferably wafers having nominal diameters of about 300 millimeters or greater.

Semiconductor wafers, especially those made of silicon, may be conventionally processed by placing them horizontally into a holding device or carrier at intervals in the vertical direction and exposing the wafers' surfaces to high temperature gases in a furnace, usually to form an oxide film on these surfaces or to deposit certain atoms therein. To maximize the amount of surface area exposed to the heat treatment, the wafers are usually held in "boats" or carriers typically comprised of parallel vertical supports or rails having relatively shallow slots or grooves evenly spaced along their length. The slots in one support are normally aligned with slots in the other support so a wafer can be jointly received by a corresponding slot in each support. By placing wafers in appropriate slots on the supports, the boat can carry a stack of wafers separated from each other so that each wafer is exposed to the heat treatment.

In the past, vertical boats and carriers have been designed to support wafers having nominal diameters of 200 millimeters or less. These size wafers are typically supported by teeth formed by slots or grooves on the vertical rails, which teeth extend inward from the edge of the wafer only a very short distance, usually less than about 20 millimeters. Unfortunately, when such design is utilized to support larger wafers, i.e., wafers having a nominal diameter greater than about 200 millimeters, the wafers are deflected by their own weight and tend to sag. As the temperature in the furnace rises, this sagging or deformation results in crystal dislocation or "slip" and other stresses on the wafer. Although "slip" typically begins to occur at about 1200° C. for wafers having nominal diameters of 200 millimeters, it probably occurs at a temperature of 1000° C. or less for wafers having diameters of 300 millimeters or larger. Crystal dislocations caused by stresses on the wafers result in a decrease in the number of chips that can be made on a wafer. This reduction in product yield results in increased manufacturing costs.

Various techniques have been suggested in an attempt to decrease the bending stress on larger wafers.

One method suggested is to locate the rails or vertical supports of the boat or carrier more toward the front of the carrier where the wafers are loaded. This, however, is difficult because of the need for an unobstructed wafer loading path. Another technique for decreasing bending stress on large wafers is taught in U.S. Pat. No. 5,492,229, the disclosure of which patent is incorporated herein by reference in its entirety. This patent teaches the use of relatively long support teeth, i.e., the support arms formed by long slits or slots on each support rail, with small contact pads located at or near the end of the teeth for supporting the wafers toward their center and not at their edges. According to this patent, the contact pads or support projections are located such that the inner portion of each wafer is supported by the pad while the peripheral portion, i.e., the portion of the wafer which extends from the edge of the wafer inward a distance of up to 10% of the wafer's radius, does not contact the pads or arms. By supporting the wafers at their inner portion with small pads, this design not only reduces the stress on the wafer caused by its own weight but also decreases heat stress caused by direct heat transfer to the wafer from the slits in the vertical supports.

The use of long support arms or teeth with small contact pads at their end to support wafers as proposed in the above-discussed patent has several disadvantages. First, the wafer support is far from uniform as it relies on one small contact pad located at or near the end of each tooth. Second, the strength of each long tooth is relatively weak to begin with and is further reduced when material is removed from the top of each tooth to form the small support pads. This, in turn, reduces the overall structural strength of the carrier. Finally, the manufacturing of rails with long support teeth is an expensive proposition that can greatly increase the costs of the wafer carrier.

SUMMARY OF THE INVENTION

In accordance with the invention, it has now been found that the structural strength of vertical wafer carriers designed to support large diameter wafers can be substantially increased, the cost of manufacturing the carriers decreased, and the support provided by the carriers made more uniform by using slats supported at or near their ends instead of long rail teeth to provide support for the wafers.

Typically, the wafer carriers of the invention effectively support semiconductor wafers having diameters between about 200 and 600 millimeters utilizing a plurality of support members which extend vertically between a top portion and a bottom portion of the carrier with two of the support members located toward the front of the carrier where the wafers are inserted. At least two sides of the carrier are comprised of a series of narrow, normally horizontal slats arranged parallel to each other in the vertical direction and attached to one of the front support members and to a support member located toward the back of the carrier such that the space between the top surface of one slat and the bottom surface of the next higher adjacent slat forms a slot into which a wafer can be inserted. The slats are arranged so that a portion of a wafer inserted into the carrier will be supported by a slat within a slot on one side of the carrier while another portion of the wafer is supported by a slat in a corresponding slot on a second side of the carrier. Preferably, the wafer is supported in the slots by one or more raised structures or pads located on the top surface of the slats that form the bottom of slots on the various sides of the carrier. In order to better support the wafer and allow clearance for its loading and unloading, it is preferred that the slats be shaped like a sinusoidal or elongated M with the two top portions of the M facing inward toward the center of the carrier. By locating a raised pad near each of the top two portions of the sinusoidal or elongated M, support for the wafer is moved further inward from the edge of the wafer to better alleviate wafer sagging.

The use of horizontal slats supported near or at each of their two ends, as opposed to the support projections or pads disclosed in U.S. Pat. No. 5,492,229, results in more effective and uniform support for the wafer and thereby more effectively decreases the stress on the wafers caused by their own weight. In addition, such slats, when attached to their vertical support members, provide increased structural strength to the wafer carrier.

BRIEF DESCRIPTION OF THE DRAWINGS

All identical reference numerals in the figures of the drawings refer to the same or similar elements or features.

DETAILED DESCRIPTION OF THE INVENTION

Figure 1:
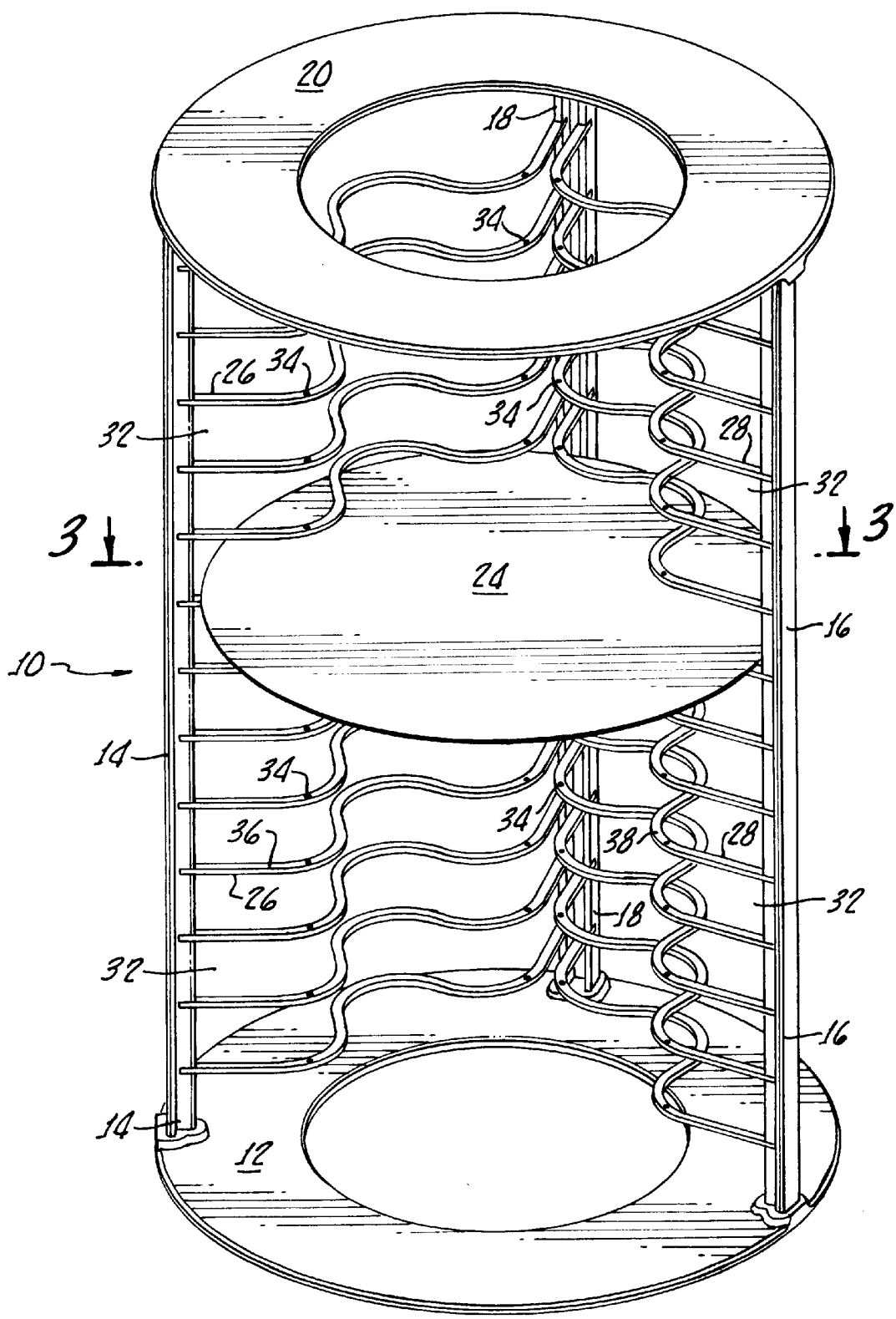
FIG. 1 of the drawings is a perspective view of an embodiment of a semiconductor wafer carrier of the invention showing how a hypothetical wafer would be held in the carrier.
Figure 2:
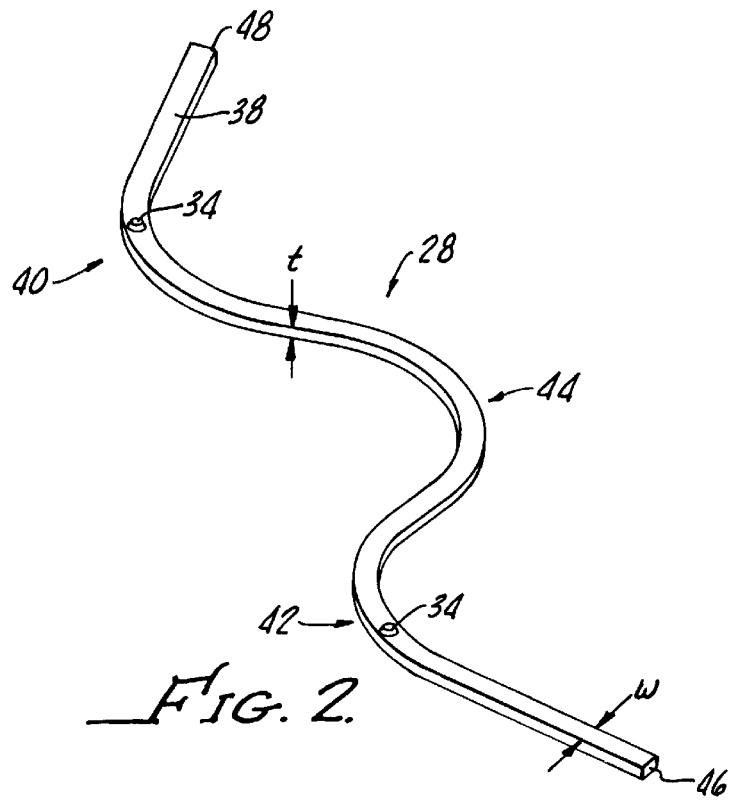
FIG. 2 is a perspective view of one of the slats shown in FIG. 1.
Figure 3:
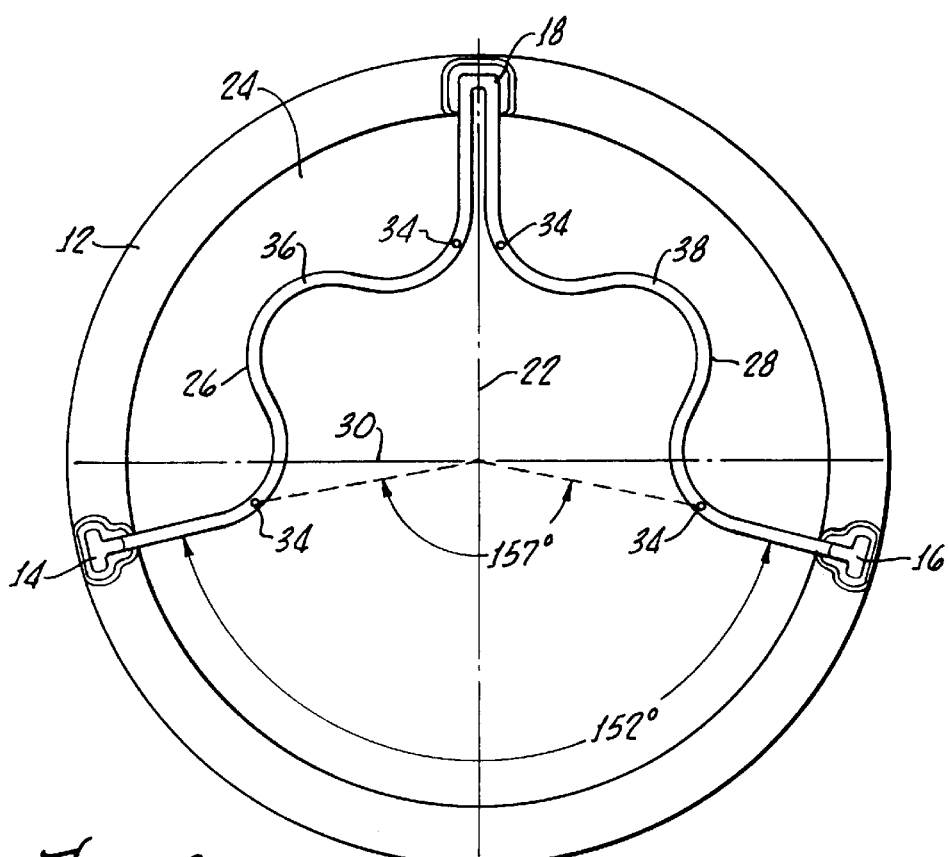
FIG. 3 is a top cross sectional view of the wafer carrier shown in FIG. 1 taken along the line 3—3.

FIGS. 1 through 3 in the drawings illustrate one embodiment of a semiconductor wafer carrier 10 of the invention. The carrier comprises a bottom portion or plate 12 on which are mounted three vertical supports or rails 14, 16 and 18 which extend upward between bottom plate 12 and a top portion or plate 20. The vertical support member 14 located on the left side of the carrier, i.e., to the left of the centerline 22 of plate 12 (see FIG. 3), is identical to and a mirror image of the vertical support member 16 located on the right side of the carrier, i.e., to the right of centerline 22. A plurality of slats 26, which are normally parallel to each other in the vertical direction, extend between and are fixedly attached to support members 14 and 18 to form the left side of wafer carrier 10. Similarly, a plurality of slats 28 extend between and are fixedly attached to support members 16 and 18 to form the right side of the wafer carrier. Each slat 26 on the left side of the carrier is a mirror image of its corresponding slat on the right side of the carrier. A perspective view of a slat 28 is shown in FIG. 2. Generally, the design of the bottom plate 12 and top plate 20 is dependent on the type of apparatus used to move the carrier in and out of the furnace where the wafers are to be heat treated and the design of the furnace itself. For this reason, the top and bottom plates shown in FIG. 1 are generic in design.

For purposes of illustrating and explaining the invention, a wafer 24 is shown in FIG. 1 in its appropriate position after being inserted into the front of wafer carrier 10. Generally, the design of the wafer carrier depends upon the size of the wafers to be held and supported. Typically, the nominal diameter of the wafers held in the carrier ranges from about 200 to about 400 millimeters, although other diameter wafers can be accommodated if desired. Such wafers usually have a thickness which ranges from about 0.5 to about 1.5 millimeters.

As shown in FIG. 1, one end of each slat 26 is fixedly attached to front support member or rail 14 (located to the front of centerline 30 shown in FIG. 3) and the other end is fixedly attached to back support member 18 (located to the back of centerline 30 shown in FIG. 3). Likewise, one end of each slat 28 is fixedly attached to front support member or rail 16 and the other end is fixedly attached to back support member 18. The spaces between the top surface of one slat 26 and the bottom surface of the next higher adjacent slat 26 and the spaces between the top surface of one slat 28 and the bottom surface of the next higher adjacent slat 28 form slots 32 into which semiconductor wafers are inserted. The slots are aligned so that a single wafer can be jointly received by a corresponding slot on the left and right sides of the carrier. Any method can be used to attach the ends of each slat to its support members as long as the slats are firmly attached so that each slat 26 and its corresponding slat 28 can support a semiconductor wafer. For example, the attachment can be made using screws, nuts and/or bolts, straps, expansion mandrels, cement, fusion, coating encapsulation, dowels, tongue and groove arrangements, dovetail connections or combinations thereof.

Although the two front support members 14 and 16 shown in FIGS. 1 and 3 have T-shaped cross sections and support member 18 has a U-shaped cross section, the front and back supports are not limited to these shapes and, if desired, may all have the same shape. For example, back support member 18 could have a horseshoe-shaped cross section or all support members could have L-shaped cross sections. The actual length of the support members or rails is dependent upon the height of the furnace in which the semiconductor wafers are to be treated. Typically, the support members will vary in length between about 0.1 and 1.5 meters, but are usually somewhere between about 0.6 and about 1.0 meter in length.

Although FIGS. 1 and 3 show that there are three support members in the wafer carrier of the invention, it will be understood that carriers containing more than three vertical supports are within the scope of the invention. Although three or four support members or rails are normally optimum from a point of view of support and cost of fabrication of the wafer carrier, more rails may be used if desired. If it is desired to use four support members, back support member 18 is normally replaced with two supports located toward the back of centerline 30 of the wafer carrier with one support on each side of centerline 22. The end of each slat 26 now shown attached to support 18, would be attached to the back support located to the left of centerline 22, and the end of each slat 28 now attached to support 18 would be attached to the other back support located to the right of centerline 22. Thus, instead of the wafer carrier having left and right sides that form a triangle as shown in FIG. 1, it would have left and right sides that form the nonparallel sides of a trapezoid.

As can be seen from FIG. 3, support member 14 is attached to and located on the left side (to the left of centerline 22) and to the front (in front of centerline 30) of bottom plate 12, support member 16 is attached to and located on the right side (to the right of centerline 22) and to the front of the bottom plate, and support member 18 is attached to and located at the back (in back of centerline 30) and on centerline 22 of bottom plate 12. Ideally, for uniformity, the three vertical support members should be equally spaced, i.e., 120°, from each other in a circle between the bottom and top plates. Unfortunately, when the diameters of these plates are within the size ranges that can be accepted by conventional wafer treatment furnaces, such an arrangement does not permit placement of the wafers into the carrier. In order for there to be sufficient clearance to load the wafers into the front of the wafer carrier, vertical support members 14 and 16 located in front of centerline 30 of plate 12 normally must be spaced between about 150° and about 175° from each other when measured the short way around bottom plate 12.

In the past, teeth located on each support member and extending horizontally inward toward the center of the carrier have been used to provide support for the semiconductor wafers. Unfortunately, as the lengths of these teeth increase in order to provide support further toward the center of larger diameter wafers, they become subject to breaking and the overall strength of the carrier is decreased. It has now been found that more uniform support can be provided to the wafers while enhancing the overall structural strength of the carrier by tying the support members together using a plurality of slats that also provide support for the wafers. Although the wafers may rest on the top surface of the slats, it is preferred that they be elevated above the top surface so that the flow of high temperature reactive gases around the wafers in the furnace is relatively unobstructed and shadowing of the wafers is therefore minimized.

One method of elevating the wafers above the surface of the slats is to use the raised structures or pads 34 shown in FIGS. 1–3. A least one raised structure 34 is attached to the top surface of each slat 26 and 28. As shown in FIGS. 1–3, it is preferred that each slat contain two raised structures. However, as few or as many can be used as desired.

It is preferred that the contact area of the raised structures with the underside of a wafer be as small as possible in order (1) to expose the maximum amount of wafer surface area to the high temperature gases and (2) to reduce heat transfer by thermal conductivity to the bottom of the wafer, which heat transfer may cause nonuniform expansion and stress on the wafer. Of course, the actual surface area of the top of each raised support structure 34 depends upon the size of the slat, which in turn depends upon the size of the wafer to be supported. Typically, the surface area of the top of the raised structures 34 ranges between about 0.1 and 50 square millimeters, preferably between about 0.5 and 10 square millimeters, and most preferably between about 1.0 and 8.0 square millimeters.

The height of a raised structure 34 is normally sufficient to allow gases in the furnace to access the area between the top surface of slats 26 and 28, represented, respectively, by reference numerals 36 and 38 in FIGS. 1–3, and the underside of each wafer. Typically, the height ranges between about 0.25 and about 10 millimeters, preferably between about 0.25 and 4.0 millimeters. The distance between the top of the raised structure and the bottom surface of the next higher adjacent slat usually ranges between about 1.5 and about 195 millimeters, preferably between about 2.0 and 25 millimeters, and most preferably between about 2.5 and 8.0 millimeters.

Although the raised structures 34 shown in FIGS. 1–3 are in the shape of a cylinder, it will be understood that the wafer carrier of the invention is not limited to having raised structures in this shape. For example, the raised structures may be in the shape of a rectangle, a square, a sphere, or a cone. The raised structure or pad can be any shape as long as its contact area with the underside of a wafer is held to a minimum to reduce stress on the wafer FIG. 2 is an enlarged perspective view of one of the slats 28 of the invention shown in FIG. 1. As can be seen, the slat is shaped like an elongated or sinusoidal M. The slat is situated in wafer carrier 10 such that the tops 40 and 42 of the sinusoidal M point inward toward the center of the carrier and the bottom portion 44 of the M points outward away from the center of the carrier. By utilizing this shape for the slats and locating the raised structures near the tops of the sinusoidal M, the support points for the wafers are moved inward toward the wafers' center. In general, the raised structures 34 are located on a slat so that they contact and support the underside of a wafer at a location along a radius of the wafer inward from the edge of the wafer a distance equal to between about 20% and 50% of the wafer radius.

Theoretically, when supporting a circular wafer, optimum support to minimize wafer sagging and stress is obtained by placing the raised structures on the slats so that they are located inward from the wafer's edge along a wafer radius a distance equal to about 30% of the wafer radius. Thus, although slats 26 and 28 can be any shape, it is desirable that they be shaped so that (1) the raised structures can be located on the slats such that this optimum value for a wafer support location is approached as near as possible and (2) sufficient clearance is available for loading and unloading the wafers into and from the carrier by, for example, robotic devices. The sinusoidal M shape shown in FIGS. 1–3 is one design that allows for both of these requirements to be achieved. For example, all four raised supports 34 shown in FIG. 3 are located a distance inward along a radius of wafer 24 equal to approximately 36% of the wafer radius and the clearance created by the bottom portion 44 of each sinusoidal M-shaped slat (see FIG. 2) provides access for the robotic arms of the wafer loading device. The sinusoidal M shape is also desirable because it gives the slats more rigidity when supporting the weight of a wafer.

Figure 5:
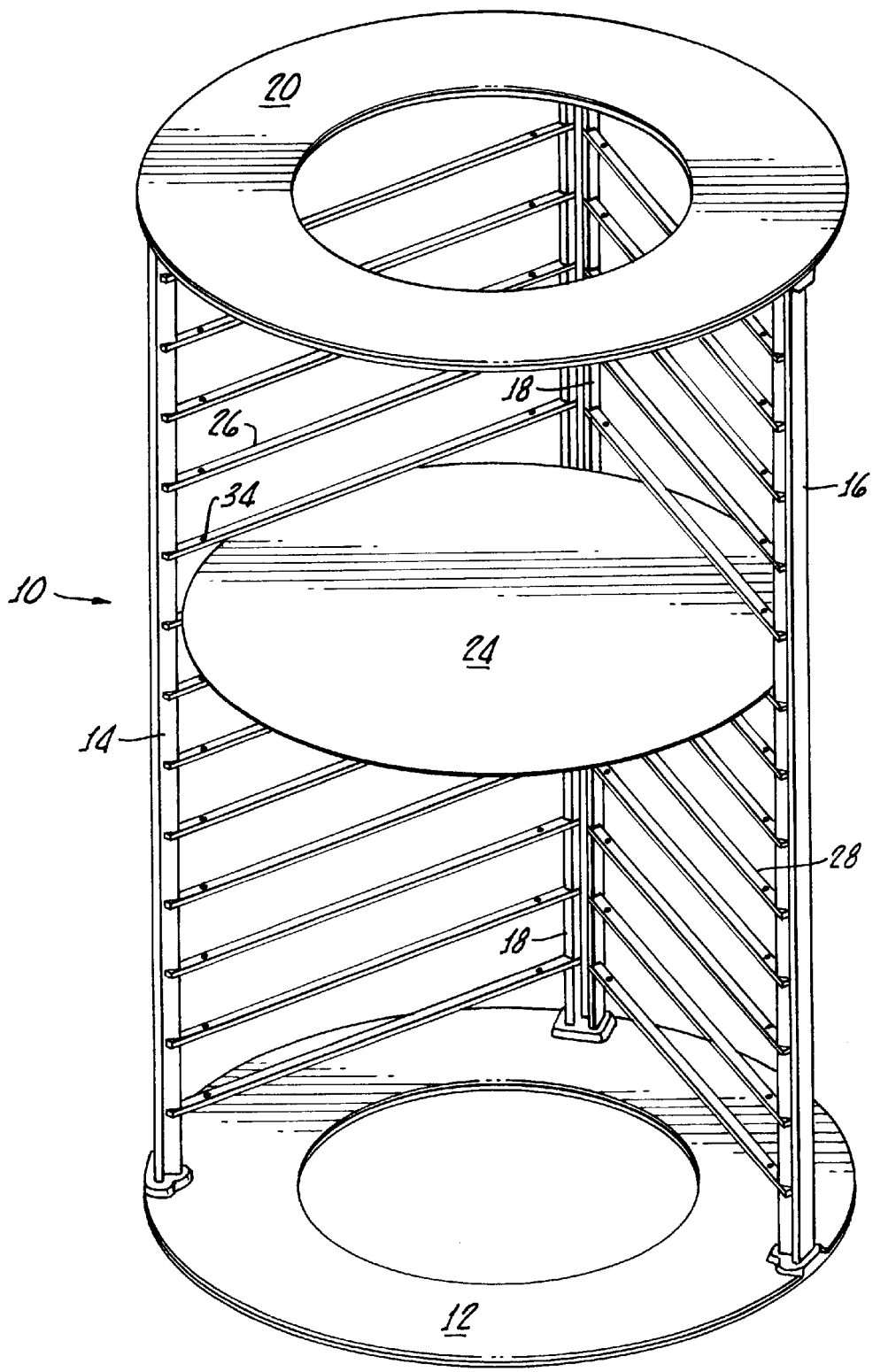
FIG. 5 is a perspective view of an embodiment of a semiconductor wafer carrier of the invention in which straight slats are used to provide support for the semiconductor wafers.

As mentioned above, although the presently preferred shape of the slats 26 and 28 is that of a sinusoidal M, any shaped slat can be used. FIG. 5 shows an embodiment of the wafer carrier of the invention in which the slats are straight. Although the slats may be any shape, it is preferred that their shape be such that the slats possess a relatively high rigidity and the raised structures can be located on the slats in positions with respect to a wafer as near as possible to the positions theoretically desired for providing optimal support to the wafer. Examples of alternate shapes for the slats of the invention include an arc of a circle, a French curve, an elongated Z, and the like.

The dimensions of the slats 26 and 28, which are mirror images of each other, normally depend on the size of the semiconductor wafers to be supported in the wafer carrier. As the size and weight of the wafers increase, the length, width and thickness of the slats will generally increase. As shown in FIG. 2, the width "w" is typically between about 2.0 and 24 millimeters, preferably between about 3.0 and 10 millimeters, and more preferably between about 4.0 and 6.0 millimeters. The thickness "t" usually ranges between about 2.0 and 25 millimeters and is preferably between about 3.0 and 8.0 millimeters. The length of slat 28 from one end 46 to the other end 48 along its top surface 38 typically ranges from about 150 to about 675 millimeters. This length is particularly dependent on the size of the wafers that wafer carrier 10 is designed to hold. For wafers having a nominal diameter of 200 millimeters, the length of slat 28 is typically between 150 and 275 millimeters. The slat length normally ranges from 275 to 350 millimeters for wafers having nominal diameters of 300 millimeters and between about 500 and 600 millimeters for wafers having nominal diameters of 500 millimeters.

The distance between the two raised support structures or pads 34 on the top surface 38 of slat 28 also depends on the size of the wafers that carrier 10 is designed to hold and is ideally equal to about 123% of the wafer radius. Generally, the distance between raised structures ranges between about 45 and 400 millimeters. The preferred distance for a wafer having a nominal diameter of 300 millimeters is usually between about 140 and about 230 millimeters, while the preferred distance for a 400 millimeter diameter wafer is about 185 to about 305 millimeters.

The number of slots 32 formed by adjacent slats 26 on the left side of carrier 10 and adjacent slats 28 on the right side of the carrier, depends upon the number of semiconductor wafers to be held by the wafer carrier 10. This, in turn, depends upon the size of the furnace to be used for heat treatment and the separation desired between wafers to adequately expose both the top and bottom surfaces of the wafers to the heat treatment. Normally, the left and right sides of carrier 10 contain between about 40 and 150 slots. For a typical larger size furnace, the number of slots normally ranges between about 80 and about 130. It will be understood, however, that the sides of the carrier of the invention can contain as few as 1 slot and as many as 180 slots. Normally, the distance between the center of one slot and the center of the next adjacent slot (the pitch) ranges between about 40 and 200 millimeters, preferably between about 5 and 20 millimeters.

As illustrated in FIG. 1, wafer carrier 10 of the invention is comprised of bottom plate 12, support members or rails 14, 16 and 18, slats 26 and 28, raised structures 34, and top plate 20. Usually, the top and bottom plates, the rails, the slats, and the raised structures are all made of the same high strength and high purity material, which is normally substantially resistant to chemical corrosion and has a high heat resistance. Examples of such materials include high temperature plastics and ceramics such as quartz, graphite, monocrystalline silicon, polycrystalline silicon, silicon carbide, and silicon carbide impregnated with silicon.

In fabricating the wafer carrier of the invention, the slats 26 and 28, the top and bottom plates 20 and 12, and the support members or rails 14, 16 and 18 are normally machined in the desired shape from a plate of the desired construction material and then fixedly attached to one another as shown in FIG. 1. Although it is possible that the raised structures 34 could be added to the slats after they are machined from the selected construction material, it is preferred that the raised structures also be machined from the construction material with the slats so that they form a monolithic structure with the slats. Thus, in fabricating the wafer carrier of the invention, it is preferred that the slats be machined from the construction material with the appropriate support structures integral therewith and then attached to the support members to form the sides of the carrier. Although it is preferred to machine the individual parts of the wafer carrier from the desired construction material, it will be understood that these individual parts may be fabricated instead by casting or molding the construction material.

When a relatively soft ceramic material, such as graphite, is used to fabricate the wafer carrier of the invention, conventional precision cutting machines may be used to machine the various parts from graphite plates. It is preferred, however, that the wafer carrier be made of silicon carbide, which is a very strong, high modulus ceramic material that will not deform or yield contaminants in the harsh environment (i.e., 300° C. to 2600° C., usually 700° C. to 1400° C.) of the furnaces in which the semiconductor wafers are processed. Unfortunately, it is very difficult to machine the slats, their associated raised structures, and the support members having grooves for holding the ends of the slats from silicon carbide with the accuracy required by the semiconductor manufacturers that use wafer carriers. It has now been found that, in fabricating wafer carriers of the invention made of silicon carbide, it is much easier to first cut and machine the individual parts of the carrier from the softer graphite, convert the graphite parts to silicon carbide, carry out any final machining or grinding needed to produce parts to exact specifications and then attach the converted parts together to form the carrier.

The first step in fabricating a silicon carbide wafer carrier of the invention is to machine the slats with their associated raised structures, the support members or rails, and the top and bottom plates from graphite blocks or plates. The grooves on the support members where the ends of the slats are attached to the supports are then machined into the supports or rails. These individual pieces are then converted into silicon carbide by heating them to high temperatures in a furnace in the presence of a mixture of silica and carbon. At the elevated temperatures in the furnace, the silica reacts with the carbon to form silicon monoxide which then reacts with the graphite pieces to form silicon carbide. This method of converting graphite into silicon carbide is described in more detail in U.S. Pat. Nos. 1,013,700 and 3,634,116, the disclosures of which are incorporated herein by reference in their entireties.

After the slats, support members, and top and bottom plates have been converted to silicon carbide, silicon carbide grinding equipment can be used to bring the parts to their exact dimensions. Once the individual parts meet specifications, the wafer carrier is assembled by connecting the rails to the bottom and top plates, normally using graphite cement, and then attaching the ends of each slat into their respective grooves on the support members, usually utilizing graphite cement. The assembled wafer carrier is then subjected to the silicon carbide conversion process described above in order to convert the graphite cement into silicon carbide, thus forming the silicon carbide wafer carrier of the invention.

Figure 4:
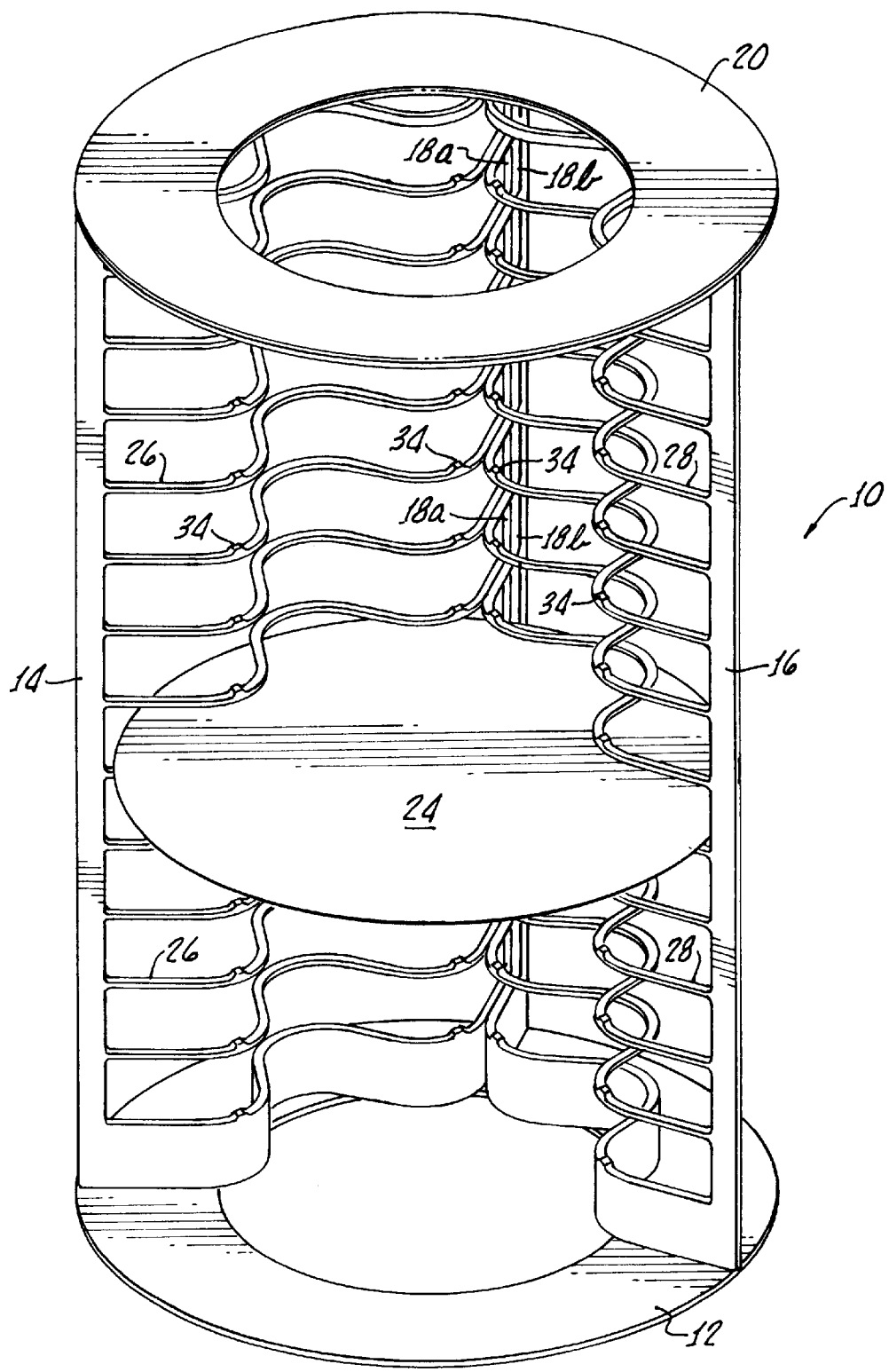
FIG. 4 is a perspective view of an embodiment of a semiconductor wafer carrier of the invention in which the slats, raised structures, and vertical support members on the left side of the carrier form a monolithic structure and the slats, raised structures, and vertical support members on the right side of the carrier form another monolithic structure.

In the embodiment of the invention shown in FIG. 1, the slats 26 and 28 with their cylindrical raised structures 34 integral therewith are separately attached at their ends to support members 14, 16 and 18. It will be understood that the invention is not limited to this embodiment. For example, FIG. 4 illustrates an alternative embodiment of the invention in which the raised structures 34 are square and the slats are integral with the vertical support members 14, 16, 18a or 18b, i.e., the vertical supports, slats, and raised support structures on the left and right sides of the carrier 10 form single monolithic bodies. Specifically, slats 26 integral with their raised structures 34 are also integral with support members 14 and 18a to form the left side of carrier 10, while slats 28 and their raised structures 34 are integral with support members 16 and 18b to form the right side of the carrier. The two monolithic sides are attached to the top and bottom plates 20 and 12, respectively, such that support members 18a and 18b abut each other at the back of the carrier. The monolithic right and left sides are machined out of a solid plate of the desired construction material into a sinusoidal M shape or cast in an appropriately shaped mold.

If the carrier shown in FIG. 4 is made of non-cast silicon carbide, the monolithic sides are machined from a plate of graphite into a sinusoidal M shape, and then converted to silicon carbide in a conversion furnace as described previously. The resultant silicon carbide monoliths are then attached to the top and bottom plates, which have also been converted to silicon carbide, and to each other at back support members 18a and 18b utilizing graphite cement. The assembled carrier is then re-subjected to the silicon carbide conversion process to convert the graphite cement into silicon carbide.

In another embodiment of the invention, the wafer carrier 10 shown in FIG. 1 is improved by adding a third plurality of slats in which each slat is fixedly attached at one end to support member 14 and at the other end to support member 16. These added slats, which may or may not contain raised structures or pads, are normally shaped differently from slats 26 or 28 in order to facilitate the insertion of the semiconductor wafers into the carrier by, for example, a robotic loading device. This third plurality of slats further ties together the vertical support members and provides the carrier with increased structural strength while enabling the carrier to provide more uniform support to the semiconductor wafers.

In the embodiments of the invention shown in FIGS. 1, 3, 4 and 5, the wafer carrier of the invention contains a first and second plurality of slats attached to the vertical support members to form the two sides of the carrier. It will be understood that the apparatus of the invention is not so limited and can include wafer carriers containing only one plurality of slats attached to two vertical support members. In such an embodiment of the invention, at least one other support member would typically contain a plurality of teeth, each of which would be used to support a portion of a semiconductor wafer. In the case where the carrier contains three support members, a portion of each wafer is supported by a slat running between two of the vertical support members while an opposite portion of each wafer is supported by a tooth on the third vertical support member. Preferably, the slats are attached to the two front support members, and the back support member contains the teeth.

Although this invention has been described by reference to several embodiments of the invention, it is evident that many alterations, modifications and variations will be apparent to those skilled in the art in light of the foregoing description. Accordingly, it is intended to embrace within the invention all such alternatives, modifications and variations that fall within the spirit and scope of the appended claims.

We claim:

1. An apparatus for holding a plurality of semiconductor wafers when inserted into the front of said apparatus, said apparatus comprising:

(a) a top portion and a bottom portion;
   (b) a plurality of support members extending essentially vertically between said top and bottom portions, wherein a first and second support member are located toward the front of said apparatus where said wafers are inserted into said apparatus and at least one support member is located toward the back of said apparatus;
   (c) a first plurality of slats, each attached to said first front support member and to a back support member, wherein the space between the top surface of one slat and the bottom surface of the next higher adjacent slat forms a slot for receiving a portion of a semiconductor wafer; and
   (d) a second plurality of slats, each attached to said second front support member and to a back support member, wherein the space between the top surface of one slat and the bottom surface of the next higher adjacent slat forms a slot for receiving a portion of a semiconductor wafer.

2. The apparatus as defined by claim 1 further comprising a plurality of raised structures for contacting and supporting said wafers, wherein at least one of said raised structures is located on the top surface of each slat that forms the bottom of a slot in said first and second plurality of slats.

3. The apparatus as defined by claim 2 containing only one back support member, wherein the slats attached to said first front support member and the slats attached to said second front support member are also attached to said back support member to form, respectively, first and second sides of said apparatus.

4. The apparatus as defined by claim 2 containing first and second back support members, wherein the slats attached to said first front support member are also attached to said first back support member to form a first side of said apparatus, and the slats attached to said second front support member are also attached to said second back support member to form a second side of said apparatus.

5. The apparatus as defined by claim 2 wherein each slat in said first and second plurality of slats is substantially straight.

6. The apparatus as defined by claim 2 wherein each slat in said first and second plurality of slats has the shape of a sinusoidal M.

7. The apparatus as defined by claim 2 wherein said first and second plurality of slats each form between about 40 and about 150 slots.

8. The apparatus as defined by claim 2 wherein the pitch of the slots formed by adjacent slats is between about 4 and about 200 millimeters.

9. The apparatus as defined by claim 2 wherein said support members are between about 0.1 and about 1.5 meters in length.

10. The apparatus as defined by claim 3 wherein said front support members have a T-shaped cross section and said back support member has a U-shaped cross section.

11. The apparatus as defined by claim 2 wherein the distance between the top of a raised structure and the bottom surface of the next higher adjacent slat is between about 1.5 and about 25 millimeters.

12. The apparatus as defined by claim 2 wherein said top portion, said bottom portion, said support members, said pluralities of slats and said raised structures comprise silicon carbide.

13. The apparatus as defined by claim 2 wherein a slat and its raised structure(s) form a monolithic body.

14. The apparatus as defined by claim 2 wherein said first front support member, said back support member, said first plurality of slats, and the raised structures on the slats in said first plurality form a monolithic body.

15. The apparatus as defined by claim 2 wherein each slat in said first and second plurality of slats contains at least two raised structures.

16. The apparatus as defined by claim 2 wherein said raised structures are cylindrical in shape.

17. The apparatus as defined by claim 2 wherein the surface area of the top of said raised structures is between about 0.5 and about 20 square millimeters.

18. The apparatus as defined by claim 2 wherein each raised structure is located on a slat so as to contact and support a wafer at a location along a radius of said wafer inward from the edge of said wafer a distance equal to between about 20% and about 50% of said radius.

19. The apparatus as defined by claim 18 wherein said wafer has a radius between about 100 and about 200 millimeters and each raised structure is located on a slat so as to contact and support said wafer at a location along a radius of said wafer inward from the edge of said wafer a distance equal to between about 20 millimeters and about 90 millimeters.

20. The apparatus as defined by claim 2 wherein said raised structures are between about 0.25 and about 10 millimeters in height.

21. The apparatus as defined by claim 2 wherein each slat in said first and second plurality of slats is between about 2.0 and about 25 millimeters wide.

22. The apparatus as defined by claim 21 wherein each slat in said first and second plurality of slats is between about 2.0 and about 25 millimeters thick.

23. The apparatus as defined by claim 2 further comprising a third plurality of slats in which each slat is attached to said first and second front support members.

24. The apparatus as defined by claim 1 wherein each slot in said first plurality of slats is aligned with a corresponding slot in said second plurality of slats.

25. An apparatus for holding a plurality of semiconductor wafers when inserted into the front of said apparatus, said apparatus comprising:

(a) a top plate and a bottom plate;

(b) three support members extending essentially vertically between said top and bottom plates, wherein the first and second support members are located toward the front of said apparatus where said wafers are inserted into said apparatus and the third support member is located toward the back of said apparatus;

(c) a first plurality of substantially horizontal and parallel slats, each fixedly attached to said first front support member and to said third support member to form a first side of said apparatus, wherein the space between the top surface of one slat and the bottom surface of the next higher adjacent slat forms a slot for receiving a portion of a semiconductor wafer;

(d) a second plurality of substantially horizontal and parallel slats, each fixedly attached to said second front support member and to said third support member to form a second side of said apparatus, wherein the space between the top surface of one slat and the bottom surface of the next higher adjacent slat forms a slot for receiving a portion of a semiconductor wafer and wherein each slot in said first plurality of slats is aligned with a corresponding slot in said second plurality of slats; and (e) a plurality of raised structures for contacting and supporting said wafers, wherein at least two raised structures are located on the top surface of each slat that forms the bottom of a slot in said first and second plurality of slats.

26. The apparatus as defined by claim 25 wherein each slat in said first and second plurality of slats has the shape of a sinusoidal M.

27. The apparatus as defined by claim 26 wherein each slat in said first and second plurality of slats has two raised structures.

28. The apparatus as defined by claim 27 wherein said top plate, said bottom plate, said three support members, said slats, and said raised structures comprise silicon carbide.

29. The apparatus as defined by claim 28 wherein said slats and their raised structures form monolithic bodies.

30. The apparatus as defined by claim 29 wherein each raised structure is located on a slat so as to contact and support a wafer at a location along a radius of said wafer inward from the edge of said wafer a distance equal to between about 20% and about 40% of said radius.

31. The apparatus as defined by claim 25 wherein said three support members are located near the edge of said bottom plate.

32. A slat, having the shape of a sinusoidal M, for horizontally supporting a semiconductor wafer in a vertical semiconductor wafer carrier.

33. The slat as defined by claim 32 further comprising at least one raised structure on its top surface for contacting and supporting said wafer.

34. The slat as defined by claim 32 or 33 having a width between about 3 and about 10 millimeters.

35. The slat as defined by claim 34 having a thickness between about 3 and about 8 millimeters.

36. The slat as defined by claim 35 having a length between about 150 and about 600 millimeters.

37. The slat as defined by claim 33 comprising two raised structures for contacting and supporting said wafer.

38. The slat as defined by claim 37 wherein one of said raised structures is located near one of the two top points of said sinusoidal M and the other raised structure is located near the other top point.

39. The slat as defined by claim 32 consisting essentially of silicon carbide.

40. The slat as defined by claim 32 comprised of a ceramic material.

41. A slat having first and second ends and adapted for use in a vertical semiconductor wafer carrier by attachment at or near one end to a first vertical support member and by attachment at or near the other end to a second vertical support member, said slat containing at least one raised structure on its top surface for contacting and supporting a semiconductor wafer.

42. The slat as defined by claim 41 comprising silicon carbide.

43. The slat as defined by claim 41 containing two raised structures located between about 90 and about 320 millimeters apart on said top surface as measured along said top surface.

44. An apparatus for use in a vertical semiconductor wafer carrier, said apparatus comprising:

(a) first and second vertical support members;

(b) a plurality of slats, each fixedly attached to said first and second vertical support members such that the space between the top surface of one slat and the bottom surface of the next higher adjacent slat forms a slot for receiving a portion of a semiconductor wafer; and (c) a plurality of raised structures for contacting and supporting semiconductor wafers, wherein at least one of said raised structures is located on the top surface of each slat that forms the bottom of a slot in said plurality of slats.

45. The apparatus as defined by claim 44 wherein said vertical support members, said slats and said raised structures form a monolithic body.

46. The apparatus as defined by claim 44 wherein said slats are in the shape of a sinusoidal M.

47. An apparatus for holding a plurality of semiconductor wafers when inserted into the front of said apparatus, said apparatus comprising:

(a) a top portion and a bottom portion;

(b) a plurality of support members extending essentially vertically between said top and bottom portions, wherein a first and second support member are located toward the front of said apparatus where said wafers are inserted into said apparatus and at least one support member is located toward the back of said apparatus; and (c) a plurality of slats, each fixedly attached to two of said support members, wherein the space between the top surface of one slat and the bottom surface of the next higher adjacent slat forms a slot for receiving a portion of a semiconductor wafer.

* * * * *